United States Patent [19]

Bourassa et al.

[11] 4,414,057
[45] Nov. 8, 1983

[54] ANISOTROPIC SILICIDE ETCHING PROCESS

[75] Inventors: Ronald R. Bourassa; Michael R. Reeder, both of Colorado Springs, Colo.

[73] Assignee: Inmos Corporation, Colorado Springs, Colo.

[21] Appl. No.: 446,597

[22] Filed: Dec. 3, 1982

[51] Int. Cl.$^3$ .................. H01L 21/306; C03C 15/00; B44C 1/22; C23F 1/02
[52] U.S. Cl. .................. 156/643; 156/646; 156/652; 156/657; 156/659.1; 156/662; 204/192 E; 252/79.1
[58] Field of Search .................. 156/643, 646, 652, 653, 156/657, 662, 659.1; 204/164, 192 E, 298; 252/79.1; 427/39, 88, 89, 90

[56] References Cited

U.S. PATENT DOCUMENTS

| | | |
|---|---|---|
| 3,940,506 | 2/1976 | Heinecke . |
| 4,208,241 | 6/1980 | Harshbarger et al. . |
| 4,211,601 | 7/1980 | Mogab . |
| 4,226,665 | 10/1980 | Mogab . |
| 4,332,839 | 6/1982 | Levinstein et al. ............ 156/643 X |
| 4,352,724 | 10/1982 | Sugishima . |
| 4,362,597 | 12/1982 | Fraser et al. ............ 156/643 |

FOREIGN PATENT DOCUMENTS

| | | | |
|---|---|---|---|
| 56-277 | 1/1981 | Japan .................. | 156/643 |

OTHER PUBLICATIONS

Adams et al., "Edge Profiles in the Plasma Etching of Polycrystalline Silicon," *J. Electrochem. Soc., Solid State and Technology*, (Feb. 1981).
Ephrath, "Reactive Ion Etching for VLSI," *IEEE Transactions on Electronic Devices*, vol. ED-28, No. 11, (Nov. 1981), pp. 1315–1319.
Hayes et al., "Planar Plasma Etching of Polycrystalline Silicon," *Solid State Technology*, (Nov. 1980), pp. 71–76.
Horwitz, "Reactive Sputter Etching of Silicon with Very Low Mask-Material Etch Rates," *IEEE Transactions on Electron Devices*, vol. ED-28, No. 11, (Nov. 1981), pp. 1320.
S. Murarka et al., "Refractory Silicides of Titanium and Tantalum for Low Resistivity Gates and Interconnects," *IEEE Transactions on Electron Devices*, vol. 27, No. 8, (Aug. 1980), pp. 1409–1417.
Wang et al., "Composite TiSi/n+Poly-Silow Resistivity Gate Electrode and Interconnect for VLSI Device Technology," *IEEE Transactions on Electron Devices*, vol. ED-29, No. 4, (Apr. 1982), pp. 547–553.
Arden et al., "Submicron MOS Process with 10:1 Optical Projection Printing and Anisotropic Etching," *IEEE (Dec. 1982), pp. 403–406*.

*Primary Examiner*—William A. Powell
*Attorney, Agent, or Firm*—Edward D. Manzo

[57] ABSTRACT

A process is described for anisotropically etching semiconductor products which include a lower dielectric layer, an intermediate polysilicon layer, and an upper silicide layer such as titanium silicide. A pattern-defining layer will normally overlie the silicide layer to define target areas to be etched. In a first step, the silicide is etched through using Freon 115 chloro, pentafluoroethane ($C_2ClF_5$) in a plasma etching chamber conditioned to provide a reactive ion etch. The etch is completed in the same chamber using a second gas which includes an amount of $Cl_2$ selected to etch anisotropically through the polysilicon layer without substantially etching the dielectric layer. Preferably, both etches occur after covering inner surfaces of the etching chamber with a material which releases molecules of the character included in the pattern-defining layer, such as Kapton, a polymide, in the disclosed example.

16 Claims, 3 Drawing Figures

4,414,057

ANISOTROPIC SILICIDE ETCHING PROCESS

BACKGROUND OF THE INVENTION

This invention is generally directed to the etching of materials in integrated semiconductor products. It is particularly directed to an improved technique for etching patterns in materials which include silicides as components of an integrated circuit product.

In fabricating semiconductor products, materials such as titanium are sometimes combined with other materials such as silicon to form a resultant material of low resistivity. In the case of titanium and silicon, the titanium may be combined with silicon to form titanium silicide ($TiSi_2$) which may have a resistance which is lower than the resistance of silicon by a factor of twenty. This low resistivity material is known to be useful in a variety of applications, such as the formation of relatively long word lines in semiconductor memories.

A known problem with the use of silicides (which, as used herein, means silicide compounds) in semiconductor products is the difficulty with which silicide is etched. Where the silicide overlies a layer of polysilicon, it has been difficult to etch through the silicide and through the polysilicon without undercutting the polysilicon material or etching the dielectric layer. Such difficulty presumably arises because of the tendency of the etchant to remove polysilicon faster than it removes the silicide.

An associated problem is that of obtaining an anisotropic etch, i.e. an etch ideally in one direction only, such as required to obtain apertures having substantially vertical sidewalls. Existing literature in the semiconductor field purports to obtain anisotropic etching in polysilicon using plasma etching techniques and certain gases. See, for example, U.S. Pat. Nos. 4,208,241 and 4,211,601. However, these existing techniques do not provide anisotropic etching of silicides, at least not of the character which is required for high volume production.

Another difficulty with existing etching techniques is their tendency to etch deeper than desired so as to remove portions of an underlying layer which is intended to be left intact. When the underlying layer is a gate oxide, removal of the gate oxide leads to difficulties with which those skilled in the art are familiar.

Accordingly, it is an object of the invention to provide an improved technique for etching patterns in materials which include silicides as components of an integrated circuit product.

It is another object of the invention to provide a method for etching highly anisotropic patterns into and through polysilicon layers which underlie a material containing silicide.

It is another object of the invention to provide such anisotropic etching and yet avoid any substantial removal of oxide which may underlie the materials to be etched.

SUMMARY OF THE INVENTION

According to one aspect of this invention, titanium silicide or other substances can be etched anisotropically by using at least two steps wherein the silicide is etched using Freon 115 ($C_2ClF_5$) or a suitable substitute in a reactive ion etch (RIE) followed by etching the underlying layer, typically polysilicon, with a mixture of chlorine and fluorine obtained from, for example, perfluoroethane ($C_2F_6$) and chlorine gas ($Cl_2$). This mixture has a higher selectively for polysilicon than for silicon oxide ($SiO_2$), so that the entire process can be used to etch a silicide layer and intermediate polysilicon layer without substantially etching an underlying silicon oxide layer.

BRIEF DESCRIPTION OF THE FIGURES

The objects stated above and other objects of the invention are set forth more particularly in the following detailed description of the accompanying drawings, of which.

DESCRIPTION OF THE PREFERRED EMBODIMENT

The present etching technique is particularly applicable to the fabrication of semiconductor memories which employ silicon word lines. However, the invention is generally applicable to any semiconductor product in which patterns are etched through a silicide structure which overlies polysilicon.

Figure 1:
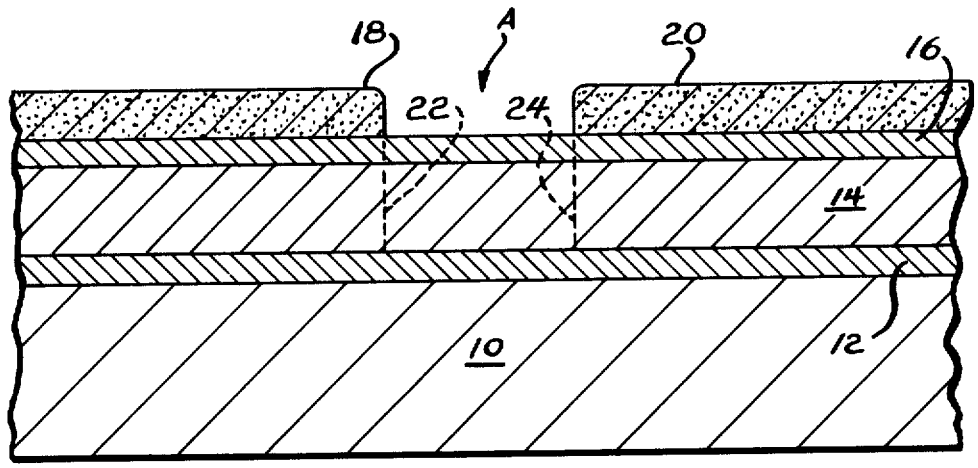
FIG. 1 is a sectional view of a portion of a wafer which may be etched according to the invention.

An exemplary structure which may be etched according to the invention is shown in FIG. 1. The illustrated structure is a portion of a semiconductor wafer having a substrate 10 covered, at least in part, by a dielectric layer 12 which is usually silicon dioxide.

Covering the dielectric 12 is a layer of doped polysilicon 14, and covering the polysilicon is a layer of titanium silicide ($TiSi_2$) 16. To form a target area which is to be etched, a pattern-defining layer of photoresist, for example, is established conventionally at 18 and 20 to leave an aperture A. The layers of silicide 16 and polysilicon 14 which are beneath the aperture A will be etched as described below. It is to be understood, however, that many more such apertures will normally be formed to define a large number of target areas which are etched simultaneously.

The purpose of the present process is to remove the polysilicon 14 and the silicide 16 where they underlie the aperture A so as to leave substantially vertical sidewalls as indicated by the dashed lines 22 and 24. In addition, the photoresist is not to be undercut or substantially damaged, nor is the dielectric layer 12 to be etched to any substantial degree.

To meet these objectives, a two step etching process is performed in a reaction vessel such as a conventional parallel plate plasma etching chamber. The first etching step is a reactive ion etch, as opposed to a plasma etch. Plasma etching and reactive ion etching (RIE) can occur when reactive gases are introduced into a partially evacuated chamber containing two electrodes to which an AC potential is applied. The potential is dropped across a sheath region near the walls and electrodes and ions and electrons in those regions are accelerated. When these ions strike a target surface (a wafer placed on an electrode), they can physically knock atoms off the surface (sputtering) or they can act as a catalyst for chemical reactions. If the chemical reaction at the surface results in the formation of a volatile molecule, some of the surface is removed (etched) by this process. Since the bombardment occurs on the surface of the target and not on any walls that might be patterned into the surface by photolithography techniques, most of the etching can be made to occur on the surface with very little effect on the walls. This is called anisotropic etching. In RIE the pressure and electrode power arrangements are set up to increase the ion bombardment relative to the normal plasma etch configuration.

Thus, in the invented etching process, a reactive ion etch is employed wherein, for example, the lower plate of the chamber is powered and a low pressure (usually less than about 100 millitorr) is maintained, as contrasted with a plasma etch which is achieved traditionally by powering the upper plate and using a pressure generally greater than 100 millitorr.

During this first step of the invented process, the silicide is removed, and preferably part of the polysilicon is also removed. Oxygen can be added to this first etch at about 5 SCCM thereby to increase the etch rate by about 16%. However, oxygen also attacks the photoresist so must be added with care, and in the preferred example described herein, it is not used.

In the second step, a different gas is used to remove the remainder of the polysilicon without substantially removing any of the underlying dielectric layer.

Two specific techniques using this two step etching process are described, a preferred technique and an alternate technique. The preferred technique involves covering the chamber plates with a substance, whereas the alternate technique does not.

In the preferred technique, both etching steps are carried out after the surfaces of the chamber plates have been covered with an organic film-forming material comprised of carbon hydrogen and oxygen, but which is free of metal ions and halogen atoms, such as polyimide, which emits molecules of the character which are included in the pattern defining layer 18, 20. Where the pattern defining layer 18, 20 is conventional photoresist, the covering of the chamber plates is selected to release atoms such as hydrogen, oxygen or carbon, and to avoid releasing molecules of metal and certain active species such as chlorine and fluorine. The polyimide film permits the second etch step etching to occur using higher pressures without eroding the photoresist and using higher percentage of (Cl$_2$) without reducing the anisotropy of the etch. This results in a higher selectively of the etch over oxide. At the same time, the formation of bristles on the dielectric layer and polysilicon redeposition are avoided. Also the uniformity of the resultant etch is improved when the chamber is coated with polyimide.

The effects attributed to this coating have been determined experimentally by the inventors. Since the film is an insulator, the effects due to covering the chamber electrodes and walls with this material will be complex. For example, secondary electrons emitted from the electrodes and walls during ion collisions will be greatly increased. This, in turn, will increase the electron temperature in the chamber. The electron temperature has a major effect on the cracking pattern of the gases used so the composition of the plasma will be changed by the film.

The two techniques are shown by the examples in the following table for 4000 Å of polysilicon covered by 2200 Å of TiSi$_2$.

|  | Example 1 (with polyimide) | Example 2 (no polyimide) |
|---|---|---|
| Freon 115 pressure | 12 mT | 12 mT |
| Freon 115 flow rate | 10 SCCM | 10 SCCM |
| power (1st etch) | 650 watts | 650 watts |
| etch rate (1st etch) | 300 Å/min | 330 Å/min |
| plate temperature (1st etch) | 23° C. | 23° C. |
| Cl$_2$ amount | 25% (volume) | 16% (volume) |
| Cl$_2$ flow rate | 4.5 SCCM | 0.8 SCCM |
| C$_2$F$_6$ flow rate | 13.5 SCCM | 4.2 SCCM |
| pressure (2nd etch mixture) | 100 mT | 50 mT |
| power (2nd etch) | 150 watts | 150 watts |
| etch rate (2nd etch) | 175 Å/min | 200 Å/min |
| plate size | 55.9cm Dia. | 55.9cm Dia. |
| plate spacing | 4.1cm | 4.1cm |
| frequency | 13.56 MHz | 13.56 MHz |
| plate temperature (2nd etch) | 23° C. | 23° C. |

The specific etching chamber used is a Plasma-Therm PK-2440 Dual Reactive Ion and Plasma Etch System, available from Plasma-Therm, Inc., Route 73, Kresson, NJ 08053. Other chambers can be used.

Figure 2:
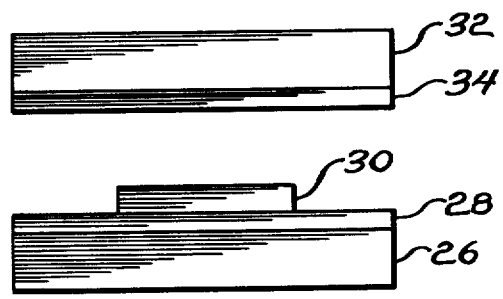
FIG. 2 is a schematic representation of the plates in a parallel plate reactor, illustrating a polyimide film which preferably covers surfaces of the plates and a wafer supported by the lower plate.

As shown in FIG. 2, the top surface of the chamber's lower plate 26 is covered with a polyimide film 28 whose thickness may be about five mils. One such film which provides satisfactory results is known as Kapton made by DuPont. Kapton includes a silicone adhesive backing for adhering the film to the plate. The wafer 30 to be processed sits on the film 28.

The lower surface of the chamber upper plate 32 is covered with a similar polyimide film 34. In practice, however, the entire inner surface of the etching chamber may be covered by a similar film although satisfactory results can be provided merely by covering the plates.

After having applied the polyimide film, the wafer is placed in the etching chamber. Gaseous Freon 115 (C$_2$ClF$_5$) is introduced into the chamber, whose power and pressure are selected to provide a reactive ion etch. In the preferred technique, a power of about 650 watts is employed, the Freon 115 is maintained at a flow rate of 12 SCCM (standard cubic centimeters per minute) at 10 millitorr, and the temperature of the lower plate is maintained at 23° C. These conditions are maintained at least until the silicide 16 has been etched through. A typical etch rate for a silicide layer is about 300 Angstroms per minute.

In the second step of the process, the semiconductor wafer remains in the etching chamber, which need not have been opened. The previously used gas is replaced by a second gas having Cl$_2$ as one component and preferably perfluoroethane (C$_2$F$_6$) as another component. The amount of Cl$_2$ included in this second step is selected to provide a highly anisotropic etch for polysilicon without substantially etching the dielectric layer 12. Taking this constraint into account, the second gas mixture is preferably about 25 percent Cl$_2$ by volume, the remainder comprising perfluoroethane (C$_2$F$_6$). With the lower plate at a temperature of 23° C., the C$_2$F$_6$ is held at a flow rate of about 13.5 SCCM, the Cl$_2$ is held at a flow rate of about 4.5 SCCM, the pressure is maintained at 100 millitorr, and a power of 150 watts is applied. Under these conditions, the remainder of the polysilicon is removed without substantially etching the underlying layer of oxide. A typical etch rate for a heavily doped polysilicon layer is 175 Å/min. The underlying layer of oxide will be etched at about 11 Å/min.

Figure 3:
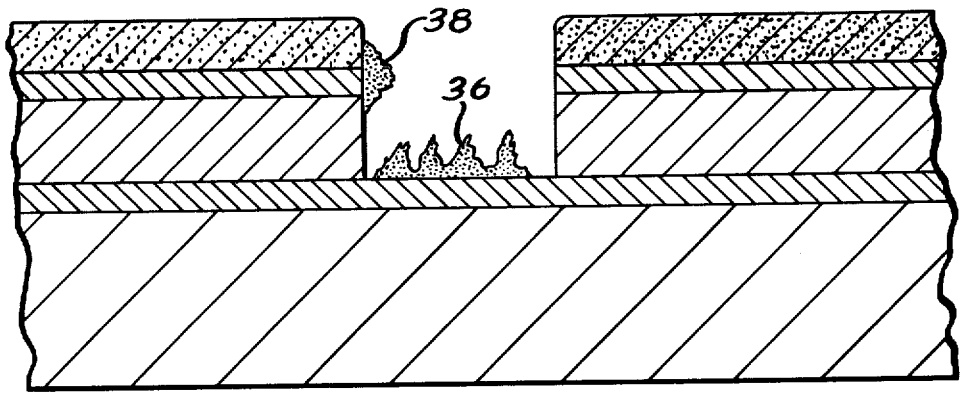
FIG. 3 illustrates a portion of an etched wafer having redeposited silicon and bristles of the type which are eliminated by the present invention.

In an alternate techinque for the invented process, the polyimide film is not used. The first step of etching through the silicide is achieved exactly as in the preferred technique by exposing the wafer to gaseous Freon 115 ($C_2ClF_5$) at a pressure of about 12 millitorr and a flow of about 10 SCCM and a power of 650 watts is applied. In the second step, the wafer is exposed to the same chlorine and perfluoroethane gases except that the flow of chlorine is reduced substantially to about 0.8 SCCM and the flow of perfluoroethane is about 4.2 SCCM. The pressure is reduced to 50 millitorr, and a power of 150 watts is applied. The reason for operating at such a low pressure is to avoid the formation of bristles and the redeposition of polysilicon which can occur at higher pressures when the polyimide film is not used. To explain more fully, FIG. 3 illustrates bristles 36 (greatly enlarged) which form on the polysilicon during etching at higher pressures without the polyimide film.

The amounts of gases set forth in Example 1 and Example 2 can be varied. In the second etching step, it has been determined that the process does work where the volume percentage of chlorine is in a range of from about 8 percent to about 35 percent. Also, it has been determined that the pressure of the Freon 115 gas can be in a range of 10 millitorr to 300 millitorr, but that best results obtain when the pressure is from 10 to 40 millitorr. Further, good results are expected at pressures down to 1 millitorr. The second gas may be at a pressure in a range of about 50 to about 350 millitorr, although results at a pressure higher than 150 millitorr show a degradation of anisotropy of the etch.

An advantage of the present invention over the processes of the prior art relates to the problem of the redeposition of etched polysilicon on the walls of the Aperture A as shown at 38. Such redeposition can fall off when the photoresist is removed and can form an unwanted mask for subsequent etching steps. Both of these problems are avoided by each of the two techniques described supra.

When the alternate technique is employed, the photoresist may be eroded slightly, but not critically, by the ion bombardment. On the other hand, no erosion of the photoresist occurs when the polyimide film is used at the higher pressures, nor are bristles or polysilicon redeposition encountered. Also, the uniformity of the etch over the area of the wafer is improved when the polyimide film is used. Accordingly, the latter technique is preferred.

With either of the illustrative techniques, a very high degree of anisotropy results. Undercutting of the photoresist and etching of the oxide are substantially eliminated.

In practicing the invention, the etch times are determined by measuring etch rates and applying those rates to the thickness of the film to be etched. For example, for an etch of 2200 Å of $TiSi_2$ on 4000 Å of heavily doped poly. Use the first etch for 15 minutes, which leaves about 1700 Å of the poly. Use the second etch for 12 minutes. This would be about 2 minutes of overetch to insure clearing the poly off of the oxide. The edges of the wafer might clear early allowing the second etch to work on the oxide for as much as 7 minutes. At the rate of 11 Å/Min on oxide, this would use up 77 Å of gate oxide. This is perfectly acceptable.

Although the invention has been described in terms of preferred and alternate techniques for applying the process to an exemplary structure to be etched, it will be apparent to those skilled in the art that many alterations and modifications may be made without departing from the invention. For example, a different etching chamber can be used, such as, illustratively, a "hex" etching chamber. It differs from a conventional parallel plate system in that the cathode is in the form of a hexagon surrounded by a larger anode to give a high ratio of anode to cathode area. The pressure, flow, and power levels required to optimize the etch will change with the plate size, plate spacing and frequency of the reactor which is used to perform the etching steps.

Additionally, the preferred percentages of gases may be altered to obtain various combinations of anisotropy and selectivity. Indeed, the gases need not be the same as set forth herein to practice the invented process. The inventors consider that if one arranges the plasma to contain the same ratio of reactants and recombinants under similar electrical conditions, the etch will be basically the same regardless of the parent gases used. Thus, other combinations of gases containing flourine and chlorine could be used as long as the percentages after cracking are similar. The $C_2F_6$ could be replaced by perhaps, $C_3F_8$, or any other carbon-fluorine compound, with some experimentation. The inventors have tried to use $CFCl_3$ (Freon 13) in place of $C_2F_6$ plus $Cl_2$, but the chlorine percentage was too high and the result was an isotropic etch, as is well known for Freon 13 on poly. The selection depends on percentages after cracking, and the cracking pattern depends on the electron temperature, which in turn depends on the gases. In addition, the process may generally be used with other silicides such as tantalum and tungsten silicides on doped polysilicon. Accordingly, it is intended that all such alterations and modifications be considered as within the spirit and scope of the invention as defined by the appended claims.

What is claimed is:

1. A process for etching selected materials in a layered semiconductor product having a lower layer, an intermediate layer, and an upper silicide layer, the process comprising the steps of:
    exposing the semiconductor product to a first gas consisting essentially of $C_2ClF_5$ at reduced pressure for a time sufficient for said first gas to etch through the silicide layer; and
    exposing the semiconductor product to a second gas comprising $Cl_2$ at reduced pressure for a time sufficient for said second gas to etch through the intermediate layer.

2. A process for etching selected portions of silicide and underlying polysilicon in a layered semiconductor product having a lower layer, an intermediate polysilicon layer, and a silicide layer thereover, the process comprising the steps of:
    defining a pattern of silicide to be etched by developing a patterned material on the silicide layer;
    placing the semiconductor product in a reaction vessel;
    exposing the semiconductor product to a first gas including gaseous $C_2ClF_5$;
    controlling the environment of said reaction vessel to promote reactive ion etching by said first gas;
    etching through the silicide layer exposed by said pattern; then
    exposing the semiconductor product to a second gas including $Cl_2$;

etching through the polysilicon layer exposed by the pattern, whereby the lower layer is not substantially etched.

3. The process of claim 2 wherein said exposing steps occur in a plasma etching chamber, and wherein said controlling the environment steps include controlling the electrical power and gas pressure.

4. The process of claim 2 wherein said second gas comprises a minor amount of $Cl_2$ and a major amount of a fluorine—carbon compound.

5. The process as set forth in claim 2 wherein the amount of $Cl_2$ in said second gas is in a range from about 8 to about 35 percent.

6. The process of claim 2 wherein the amount of $Cl_2$ in said second gas is about 16 percent.

7. The process as set forth in claim 2 wherein said second gas includes $C_2F_6$.

8. The process of claim 2 wherein said first gas is maintained at a pressure of about 12 millitorr.

9. The process as set forth in claim 2 wherein said first gas is maintained at a pressure in a range from about 1 to about 40 millitorr.

10. The process as set forth in claim 2 wherein said first gas is maintained at a pressure of up to about 300 millitorr.

11. The process as set forth in claim 2 wherein said second gas is maintained at a pressure in a range of about 50 to about 350 millitorr.

12. A process as set forth in claim 2 wherein an aperture-defining layer covers said upper silicide layer; said process further comprising the step of covering the surface of said plates, prior to the etching steps, with a material which releases predominantly molecules of the character included in the aperture—defining layer.

13. The process as set forth in claim 11 wherein said material is a polyimide film.

14. The process as set forth in claim 12 wherein said second gas includes about 25 percent of $Cl_2$ and about 75 percent of $C_2F_6$.

15. The process of claim 14 wherein said second gas is maintained at a pressure of about 100 millitorr.

16. For a semiconductor product which includes a lower layer of silicon dioxide, an intermediate polysilicon layer, and an upper layer of titanium silicide, a process for etching target areas from the polysilicon and titanium silicide, comprising the steps of:
   covering inner surfaces of a plasma etching chamber with a polyimide film;
   placing the product and a first gas comprising $C_2ClF_5$ in the plasma etching chamber at a pressure and a power selected to provide a reactive ion etch;
   etching with said first gas through the silicide layer at least to the polysilicon layer; then
   replacing said first gas with a second gas comprising $C_2F_6$ and $Cl_2$, the amount of $Cl_2$ being selected to provide a highly anisotropic etch and an etch selectivity which inhibits substantial etch of silicon dioxide; and then
   etching with said second gas through the polysilicon layer.

* * * * *